(12) United States Patent
Nealey et al.

(10) Patent No.: US 9,927,706 B2
(45) Date of Patent: Mar. 27, 2018

(54) ATOMIC LAYER CHEMICAL PATTERNS FOR BLOCK COPOLYMER ASSEMBLY

(71) Applicants: The University of Chicago, Chicago, IL (US); Wisconsin Alumni Research Foundation, Madison, WI (US)

(72) Inventors: Paul Franklin Nealey, Chicago, IL (US); Tzu-Hsuan Chang, Madison, WI (US); Shisheng Xiong, Darien, IL (US); Zhenqiang Ma, Middleton, WI (US); Michael Scott Arnold, Middleton, WI (US); Robert Jacobberger, Madison, WI (US)

(73) Assignees: The University of Chicago, Chicago, IL (US); Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 15/215,016

(22) Filed: Jul. 20, 2016

(65) Prior Publication Data
US 2017/0062229 A1 Mar. 2, 2017

Related U.S. Application Data

(60) Provisional application No. 62/194,661, filed on Jul. 20, 2015.

(51) Int. Cl.
*G03F 7/004* (2006.01)
*G03F 7/16* (2006.01)
(Continued)

(52) U.S. Cl.
CPC .............. *G03F 7/165* (2013.01); *B82Y 30/00* (2013.01); *B82Y 40/00* (2013.01); *C08L 53/00* (2013.01);
(Continued)

(58) Field of Classification Search
CPC .......... H01L 21/0271; H01L 21/02527; H01L 21/02568; B82Y 30/00; B82Y 40/00;
(Continued)

(56) References Cited

U.S. PATENT DOCUMENTS

| 9,640,391 B2* | 5/2017 | Yang | H01L 21/02568 |
| 2008/0124833 A1* | 5/2008 | Ruiz | H01L 45/06 438/102 |

(Continued)

OTHER PUBLICATIONS

Yim et al, "Surface-Shielding Nanostructures Dervied from Self-Assembled Block Copolymers Enable Reliable Plasma Doping for Few-Layer Transition Metal Dichalcogenides", Advanced Functional Materials, Jun. 2016.*

(Continued)

*Primary Examiner* — Amanda C Walke
(74) *Attorney, Agent, or Firm* — Weaver Austin Villeneuve & Sampson LLP (57) ABSTRACT

Provided herein are methods of directed self-assembly (DSA) on atomic layer chemical patterns and related compositions. The atomic layer chemical patterns may be formed from two-dimensional materials such as graphene. The atomic layer chemical patterns provide high resolution, low defect directed self-assembly. For example, DSA on a graphene pattern can be used achieve ten times the resolution of DSA that is achievable on a three-dimensional pattern such as a polymer brush. Assembly of block copolymers on the atomic layer chemical patterns may also facilitate subsequent etch, as the atomic layer chemical patterns are easier to etch than conventional pattern materials.

17 Claims, 8 Drawing Sheets

Atomic thin graphene chemical pattern (51) Int. Cl.
  *H01L 21/308* (2006.01)
  *H01J 37/32* (2006.01)
  *C09D 153/00* (2006.01)
  *H01L 21/02* (2006.01)
  *C08L 53/00* (2006.01)
  *B82Y 30/00* (2011.01)
  *B82Y 40/00* (2011.01)
  *C23C 16/02* (2006.01)
  *C23C 16/26* (2006.01)
  *G03F 7/00* (2006.01)

(52) U.S. Cl.
  CPC ........ *C09D 153/00* (2013.01); *C23C 16/0227* (2013.01); *C23C 16/26* (2013.01); *G03F 7/168* (2013.01); *H01J 37/32009* (2013.01); *H01L 21/02527* (2013.01); *H01L 21/02568* (2013.01); *H01L 21/3081* (2013.01); *H01L 21/3086* (2013.01); *G03F 7/002* (2013.01); *H01J 2237/334* (2013.01)

(58) Field of Classification Search
  CPC ....... C08L 53/00; C09D 153/00; G03F 7/002; G03F 7/168
  USPC ................ 977/734, 890; 438/478; 430/270.1
  See application file for complete search history.

(56) References Cited

U.S. PATENT DOCUMENTS

| | | | | |
|---|---|---|---|---|
| 2012/0121891 | A1* | 5/2012 | Kim | B82Y 10/00 428/323 |
| 2013/0302553 | A1* | 11/2013 | Winarski | G11B 7/2548 428/65.2 |
| 2015/0123079 | A1* | 5/2015 | Kim | H01L 31/02327 257/29 |
| 2016/0339160 | A1* | 11/2016 | Bedworth | A61M 1/1623 |

OTHER PUBLICATIONS

Park, S., et al., "Device-oriented graphene nanopatterning by mussel-inspired directed block copolymer self-assembly," *Nanotechnology*, vol. 25, 2014, 014008, pp. 1-6.

Yamamoto, T., "Block Copolymer Permeable Membrane with Visualized High-Density Straight Channels of Poly(ethylene oxide)," *Adv. Funct. Mater.*, 2011, vol. 21, pp. 918-926.

Yoshimoto, K., "Optimization of directed self-assembly hole shrink process with simplified model," *J. Micro/Nanolith.*, MEMS MOEMS, vol. 13, No. 3, 031305, Jul.-Sep 2014, 8 pages.

Park, et al., "Enabling nanotechnology with self assembled block copolymer patterns," Polymer 44, 2003 pp. 6725-6760.

* cited by examiner

Figure 1(b)

Block Copolymer Assembly

Figure 1(a)

Atomic thin graphene chemical pattern

ATOMIC LAYER CHEMICAL PATTERNS FOR BLOCK COPOLYMER ASSEMBLY

CROSS-REFERENCE TO RELATED APPLICATION

This application claims the benefit of priority to U.S. Provisional Application No. 62/194,661, titled "ATOMIC LAYER CHEMICAL PATTERNS FOR BLOCK COPOLYMER ASSEMBLY," filed Jul. 20, 2015, all of which is incorporated herein in its entirety and for all purposes.

STATEMENT OF GOVERNMENTAL SUPPORT

This invention was made with government support under N00014-09-1-0803 awarded by the US Navy/ONR, 0832760 awarded by the National Science Foundation, and DE-SC0006414 awarded by the US Department of Energy. The government has certain rights in the invention.

BACKGROUND

Block copolymers can assemble into large-scale, dense, and regular nanoscale patterns, making block copolymer assembly a potential candidate for nanolithography. The pattern of a block copolymer material can follow a chemical pattern to generate a regular structure, in a technique referred to as directed self-assemble (DSA) by chemical epitaxy. Polystyrene (PS) based chemical patterns are a commonly used system and can be fabricated by dissolving PS in solvent and casting the solution uniformly over large area.

SUMMARY

Provided herein are methods of directed self-assembly and related compositions. One aspect of the disclosure relates to a composition including a chemical pattern that includes a patterned two-dimensional material and a microphase-separated block copolymer material overlying the chemical pattern, with the domains of the microphase-separated block copolymer material assembled in accordance with the chemical pattern. Examples of two-dimensional materials include graphene, graphyne, borophene, silicene, stanene, boron nitride, carbon nitride, silicon carbide, rhodium, palladium, nickel HITP, tungsten diselenide, and molybdenum disulfide. In some embodiments, the two-dimensional material is a transition metal dichalcogenide.

In some embodiments, the chemical pattern has a first density and the domains of the microphase-separated block copolymer material have a second density with the second density being greater than the first density. In this manner, density multiplication of the chemical pattern is achieved. For example, the second density may be at least five times greater than the first density (for at least 5× density multiplication) or at least ten times greater than the first density (for at least 10× density multiplication). In some embodiments, the chemical pattern includes a feature that differs from the bulk morphology of the block copolymer.

Another aspect of the disclosure relates to a method including providing a composition a chemical pattern including (a) a patterned two-dimensional material and (b) a microphase-separated block copolymer material overlying the chemical pattern, wherein domains of the microphase-separated block copolymer material are assembled in accordance with the chemical pattern, wherein the domains of the microphase-separate block copolymer material form a second pattern; and transferring the second pattern to a substrate. Providing the composition may include patterning a substrate with the two-dimensional material and depositing the block copolymer material on the two-dimensional material. The method may further include inducing the block copolymer material to self-assemble in accordance with the chemical pattern.

These and other aspects of the disclosure are discussed further below with reference to the Figures.

BRIEF DESCRIPTION OF THE FIGURES

FIG. 5(b) shows the AFM scanned thickness difference of graphene stripes on a germanium (Ge) substrate after oxygen plasma etching.

DETAILED DESCRIPTION

Block copolymers can assemble into large-scale, dense, and regular nanoscale patterns, making block copolymer assembly a potential candidate for nanolithography. The pattern of a block copolymer material can follow a chemical pre-pattern to generate a regular structure, in a technique referred to as directed self-assemble (DSA) by chemical epitaxy.

Provided herein are atomic layer chemical patterns for block copolymer assembly, assembled block copolymer films, and related devices. Examples of materials for atomic layers include a family of materials referred to as two-dimensional materials. These include graphane, graphyne, graphene, germanane, germanene, borophene, silicene, stanene, phosphorene, boron nitride (BN), carbon nitride, silicon carbide, metals such as palladium and rhodium, and metal-containing compounds including nickel HITP and transition metal dichalcogenides such as tungsten diselenide ($WSe_2$) and molybdenum disulfide ($MoS_2$). The atomic layers are also referred to as two-dimensional layers or layers of two-dimensional materials. The two-dimensional materials may be inorganic or organic materials.

The two-dimensional layers include layers that are a single atom thick (like graphene) as well as layers that may have a thickness greater than 1 atom (like molybdenum disulfide), but with a thickness of no more than a few nanometers. The two-dimensional layers are generally layers of a material that have closed bonds in two dimensions. The two-dimensional layers are typically two-dimensional crystals. The chemical patterns may be formed in a monolayer or in multiple layers of a two-dimensional material. The layers may be characterized as having a lack of topography as compared to polymer brush layers and mats and self-assembled monolayers. Topography refers to both the step height from a two-dimensional material guiding feature to an underlying surface, as well as the surface roughness of the two-dimensional material. For monolayers of two-dimensional materials, the step height corresponds to the size of one atom or other unit of the material. The two-dimensional materials may be atomically smooth. Because the two-dimensional materials have closed bonds in two-dimensions, the materials may be impenetrable. This can allow a chemical pattern to avoid entanglement with molecules of a block copolymer layer.

Polystyrene (PS)-based chemical patterns are the most commonly used system in DSA. PS-based patterns are prepared by dissolving PS in a solvent and casting the solution uniformly over a large area to form a PS film. The chemical resistance of the PS film can be further strengthened by adding a cross-linking agent to the solution. The cross-linked PS (X-PS) film becomes chemically inert and stable for the further fabrication steps. PS films are preferential to the PS block of polystyrene-b-poly (methyl methacrylate) (PS-b-PMMA) in terms of wetting, PS-b-PMMA being the most common block copolymer system. This enhances the yield and stability in the assembled structures. Without being bound by a particular theory, it is believed that PS-based and other polymer brushes and mats may become entangled or intertwined with block copolymers, slowing their kinetics in moving toward equilibrium.

The atomic layer chemical patterns disclosed herein provide high resolution, low defect directed self-assembly. For example, DSA on a graphene pattern can achieve 10× the resolution of DSA on a polymer brush or mat. Assembly of block copolymers on the atomic layer chemical patterns may also facilitates subsequent etch, as the atomic layer chemical patterns are easier to etch than conventional pattern materials.

Atomic layers of graphene or other materials are generally not sufficiently thick to serve as a boundary for a geographically regulated pattern to lead to the assembly of a block copolymer. In the methods and compositions described herein, chemical contrast between the atomic layer material and underlying surface directs the assembly of the block copolymer material. For example, there may be a hydrophilic/hydrophobic contrast. As such, an atomic layer material and surface can be chosen to interact with a particular block copolymer material such that the chemical contrast pattern can direct the assembly of the block copolymer material.

Graphene has similar wetting behavior to PS and sub-nm thicknesses. The smooth and even graphene surface enhances block copolymer assembly. With well-constructed sp2 carbon, graphene can remain stable up to several hundred degrees in temperature and does not deteriorate as the processing temperature becomes higher. In addition to the physical strength, graphene is resistant to corrosives, chemically inert to many chemicals, and has a consistent surface condition.

An atomic layer film may be deposited by chemical vapor deposition (CVD) or other appropriate method and patterned. The patterned atomic layer film guides the assembly of a block copolymer material into large area, highly ordered patterns. In one example, conformal and high quality CVD graphene films are deposited on germanium wafers. The deposited graphene can be as thin as 0.335 nm, forming nearly no topography compared to the spun-on polymer brush and mat chemical patterns.

Figure 1A:
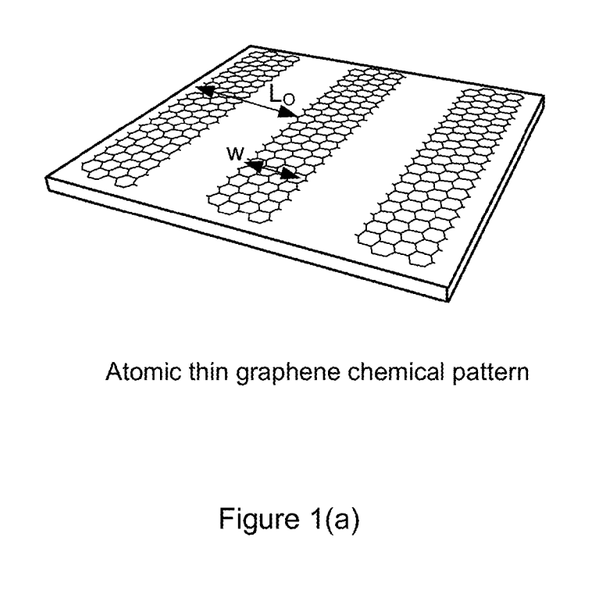
FIG. 1(a) shows a schematic representation of a graphene chemical pattern, the pattern including stripes of graphene of width W, with a pattern period (width of adjacent stripes) of $L_0$.
Figure 1B:
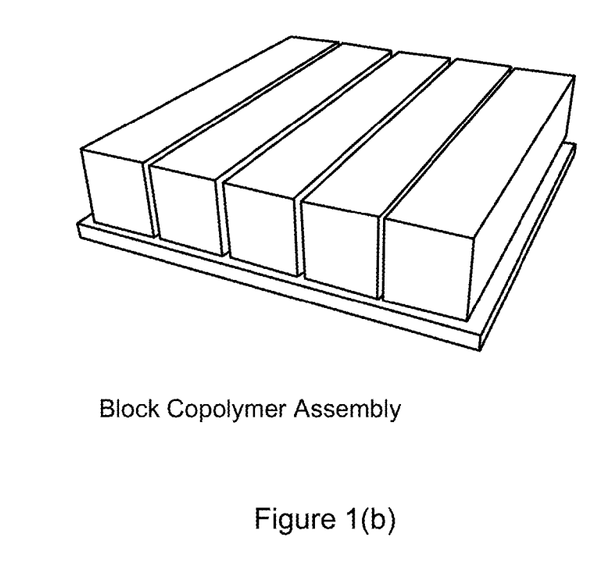
FIG. 1(b) shows a schematic representation of a lamellae-forming block copolymer directed to assemble on the graphene chemical pattern shown in FIG. 1(b), such that one phase of the block copolymer is registered with the graphene stripes.

FIG. 1(a) shows a schematic representation of a graphene chemical pattern, the pattern including stripes of graphene of width W, with a pattern period (width of adjacent stripes) of $L_0$. $L_0$ is the period of the block copolymer to be deposited on the graphene. FIG. 1(b) shows a schematic representation of a lamellae-forming block copolymer directed to assemble on the graphene chemical pattern, such that one phase of the block copolymer is registered with the graphene stripes. In this manner, the domains of the block copolymer are assembled in accordance with the chemical pattern. As used herein, "assembled in accordance with a chemical pattern" refers to the features of the chemical pattern being replicated in the domains of the block copolymer film.

Figure 2:
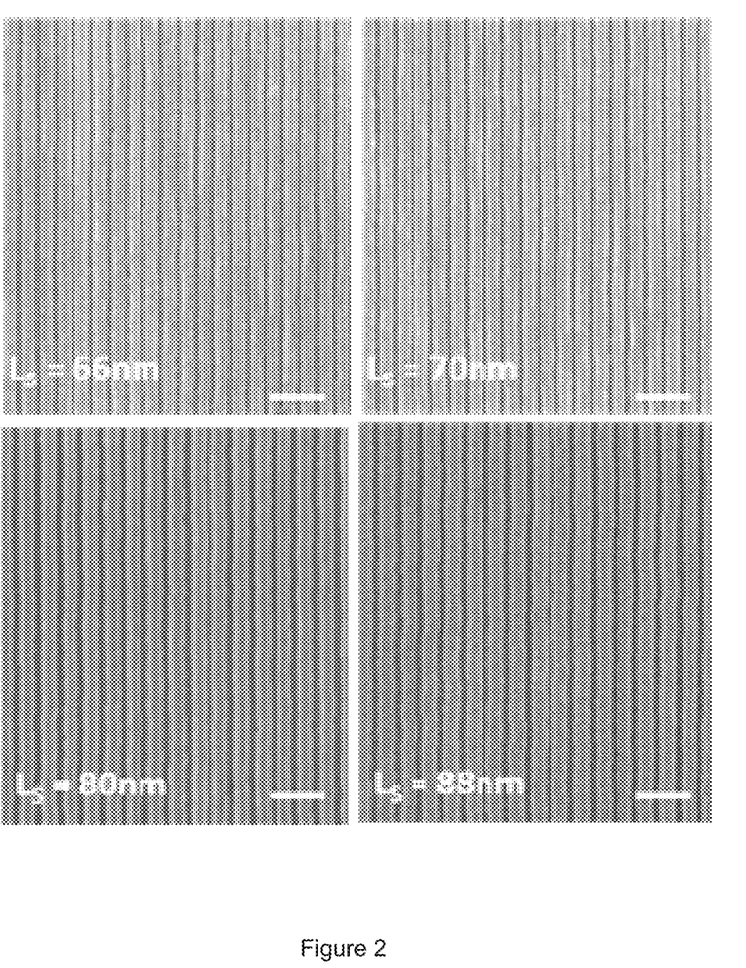
FIG. 2 shows scanning electron microscopy (SEM) images of a polystyrene-block-poly(methyl methacrylate) (PS-b-PMMA) block copolymer ($L_0$=78 nm) assembled 1:1 graphene chemical patterns.

In the example of FIG. 1(a), there is a 1:1 correspondence between the chemical pattern and the domains of the assembled block copolymer. FIG. 2 shows SEM images of a PS-b-PMMA ($L_0$=78 nm) assembled on such 1:1 chemical patterns. The graphene chemical patterns underlying the assembled PS-b-PMMA have pitches of $L_S$ (also referred to as feature spacing or pattern period) of 66 nm, 70 nm, 80 nm and 88 nm, as indicated in FIG. 2. The pitches are said to be commensurate to $L_0$ of the PS-b-PMMA block copolymer. A commensurate pitch is one that is close enough to $L_0$ or a multiple thereof to direct the assembly of the block copolymer. The assembled lamellar domains of the PS-b-PMMA block copolymer align with the underlying chemical pattern, exhibiting a compressibility of about 15% and a stretchability of about 20%. This commensurability window is greater than that achieved with conventional chemical patterns.

Figure 3:
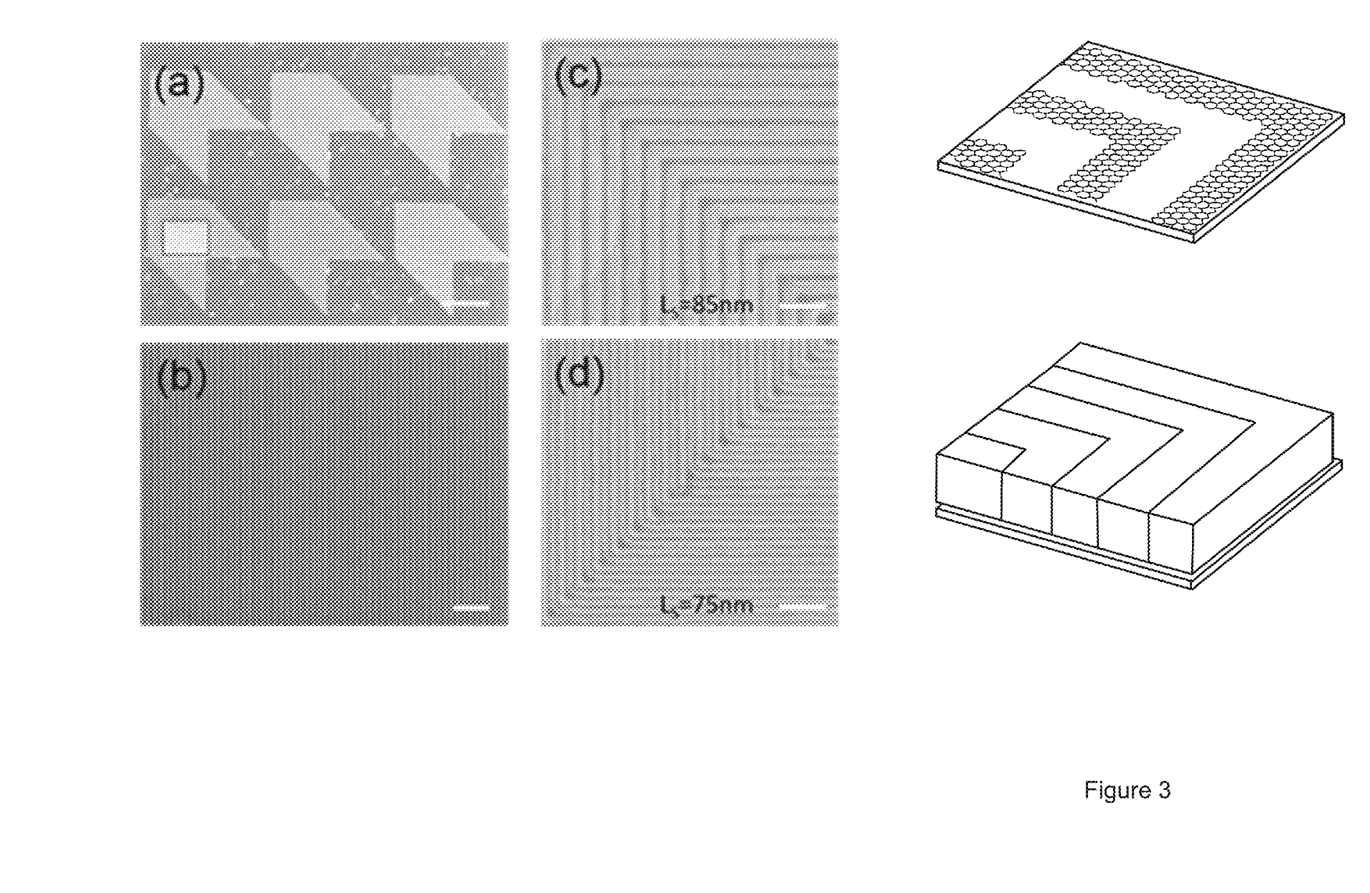
FIG. 3 shows SEM images of block copolymers assembled on graphene patterns including 90° bends and schematic representations of a graphene pattern including a bend and block copolymer assembly on the graphene pattern.

In some embodiments, "irregular" chemical patterns, such as chemical patterns having bends are used, with the block copolymer directed to assemble by the irregular patterns such that the bend or other feature of the chemical pattern is replicated in block copolymer. An irregular pattern is a pattern that includes a feature that differs from the morphology of the block copolymer in the bulk. The patterns may also be referred to as "aperiodic" and have one or more features that interrupt a periodic pattern. FIG. 3 shows SEM images of block copolymers assembled on graphene patterns including 90° bends. In the bending structure, the line to line distance at the turning corner is 45% longer than $L_0$ of the block copolymer, which is beyond the limit of the block copolymer stretch-ability. Usually, a homopolymer is added to form a block copolymer/homopolymers blend to allow the blend to bend in accordance with a 90° bend or other irregular feature. However, on the atomic-layer-thin graphene chemical pattern, 90° bending was achieved without addition of homopolymer. Other examples of irregular chemical patterns are provided in U.S. Pat. No. 8,287,957 titled "Methods and compositions for forming aperiodic patterned copolymer films," which is incorporated by reference herein.

Figure 4:
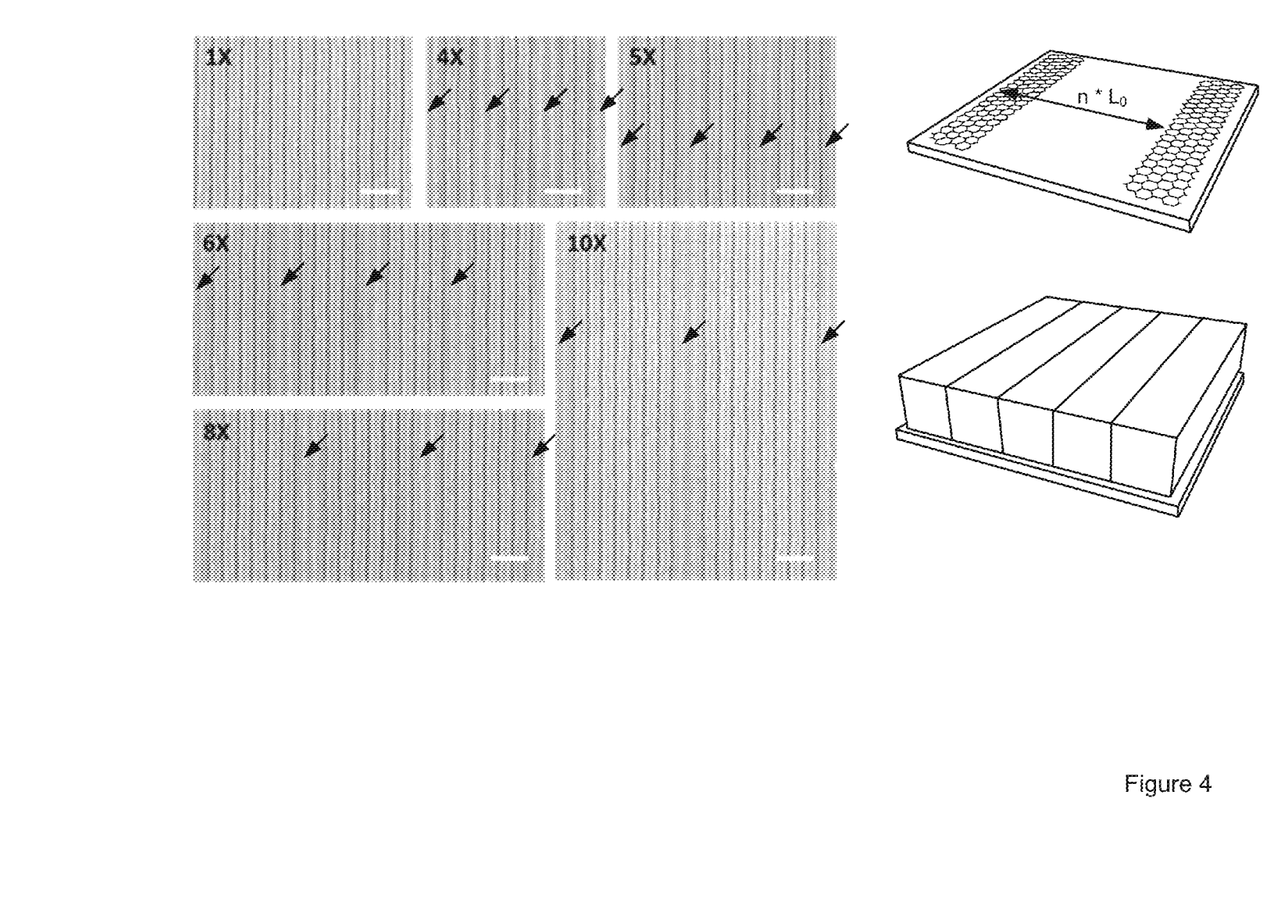
FIG. 4 shows the SEM images of block copolymers assembled on sparse graphene patterns schematic representations of a sparse graphene pattern and denser block copolymer assembly on the sparse graphene pattern.

One advantage of block copolymer lithography lies in the capability of directed assembly on a sparse chemical pattern to enhance the patterning resolution. Herein we also demonstrate the DSA of block copolymers on a two-dimensional chemical pattern with density multiplication, where the pattern created at the substrate surface has a lower density of features than the block copolymer domain density of features. FIG. 4 shows the SEM images of block copolymers assembled on sparse graphene patterns. Directed assembly of block copolymers was achieved at 4×, 5×, 6×, 8×, and 10× the density of the chemical pattern. The placement of the graphene guiding lines of the chemical patterns is indicated by the arrows over the SEM images in FIG. 4 for the sparse chemical patterns. Higher multiplication factors may be achieved, e.g., 20× or higher. The density multiplication factor is unexpectedly much higher than previously achieved with conventional polymer brush patterns.

Once assembled, one of the domains of the block copolymer thin film can be removed, e.g., by an oxygen plasma, thereby creating raised features of the other domain. The resulting topographic pattern can be transferred to the underlying substrate using the topographic pattern as an etch mask or to a second substrate using a molding or nanoimprinting process. Pattern transfer techniques such as reactive ion etch and thin film deposition may be employed. In this manner, integrated circuits, information storage media, nanoimprint templates, and the like may be fabricated.

In one example of fabricating magnetic media, a nanoimprint template is fabricated by transferring a topographic pattern including raised cylinders to a quartz substrate. A disk or other substrate that is coated with a magnetic film and hard mask is nanoimprinted. Once the hard mask is removed, isolated cylinders of magnetic film material.

Additional details on pattern transfer techniques can be found in U.S. Pat. Nos. 8,900,467; 8,475,669; 8,475,670 and 8,039,196, which are incorporated by reference herein.

Experimental

CVD single layer graphene was grown on germanium (Ge) substrates for block copolymer assembly. Ge substrates with (111) surface facet and resistivity >30 Ω-cm were purchased from Semiconductor Wafer, Inc. The Ge(111) samples were sonicated in acetone and isopropyl alcohol for 15 minutes to clean their surfaces and then etched in deionized water at 90° C. for 15 minutes to remove the native oxide. The Ge(111) substrates were loaded into a horizontal tube furnace with quartz tube diameter of 1.25 inches and a turbo pump was used to evacuate the system to approximately $10^{-6}$ Torr. The chamber was filled to atmospheric pressure with a flow of 200 sccm argon (99.999%) and 100 sccm hydrogen (99.999%) for 15 minutes to purge residual oxygen from the system and to stabilize the growth environment. The samples were annealed in the flow of 200 sccm argon and 100 sccm hydrogen for 30 minutes at 910° C. before introducing 4.4 sccm methane (99.99%), which served as the carbon precursor, to start the graphene synthesis. The growth occurred for 12 hours to ensure complete graphene coverage on the Ge(111) surface. In order to terminate growth, the samples were rapidly cooled by sliding the furnace away from the growth region. The morphology and coverage of the graphene films on Ge(111) were characterized with atomic force microscopy (Veeco Multi-Mode SPM) in tapping mode and scanning electron microscopy (Zeiss LEO 1530). The graphene quality was assessed via Raman spectroscopy (Thermo Scientific DXR) using excitation wavelength of 532 nm, power of 10 mW, and spot size of 0.6 μm. The thickness of the graphene was verified through patterning the graphene into stripes using oxygen plasma.

Figures 5A, 5C:
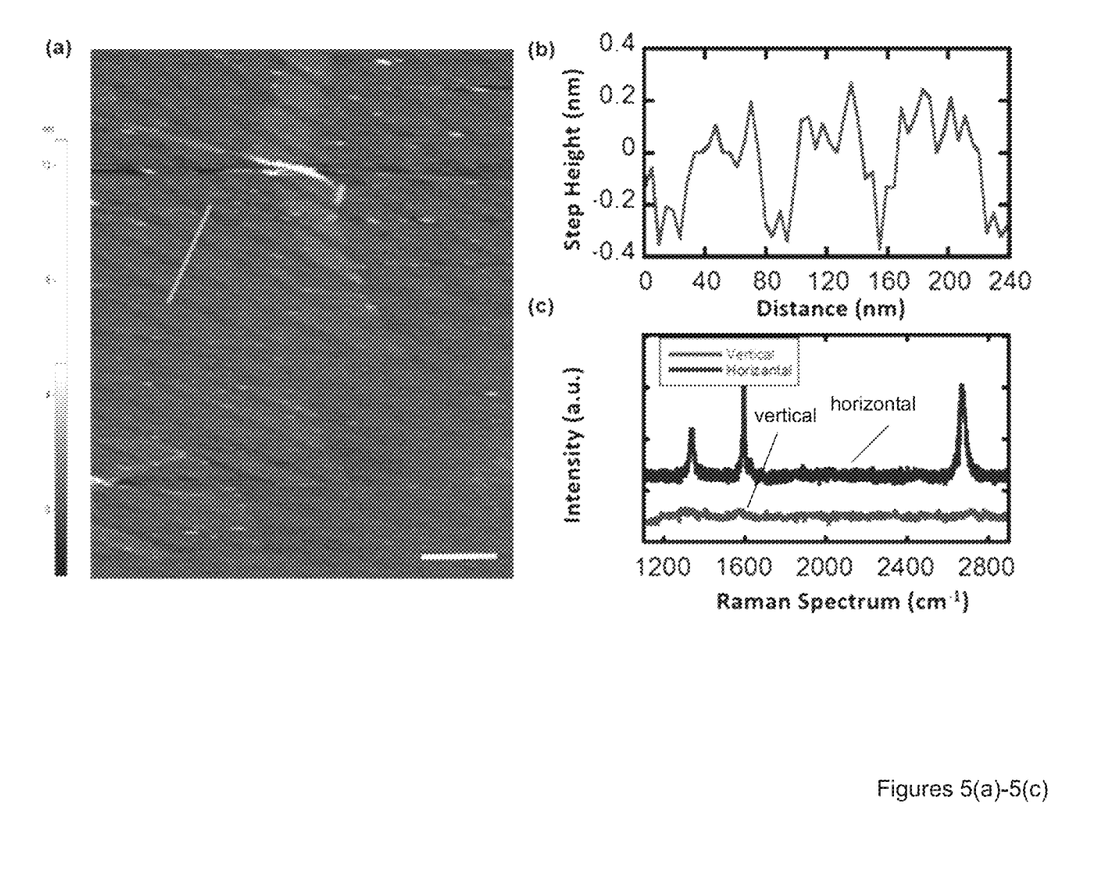
FIG. 5(a) is an atomic force microscopy (AFM) image of a graphene nanoribbon having a periodic pitch size 78 nm.
FIG. 5(c) shows a Raman spectrum of the graphene stripes along the stripes direction (horizontal) and along 90 degrees of the stripes direction (vertical).

An AFM image of the prepared graphene is shown in FIG. 5a with majority monolayer region and part of the bilayer region on the top corner. FIG. 5b shows the step height of the intercept line and the graphene thickness are 0.4 nm, which indicates the cleanness and smoothness of the graphene surface. The vertical polarized Raman spectrum peak (bottom line) in FIG. 5c is small compared to the parallel spectrum in the graphene stripes. The Raman spectrum showed a clear and wide D band caused by the oxygen plasma defining the graphene stripes.

Having a single atomic layer thickness, graphene is not sufficiently thick to serve as a boundary for a geographically regulated pattern to lead to the assembly of a block copolymer. A chemical contrast (e.g., between a hydrophilic and hydrophobic surface) may come from the hydrophobic nature of the graphene. The surface of the graphene is generally considered similarly hydrophobic but different from its bulk graphite type. A water contact angle test showed that the surface of graphene is affected by both the number of layers, substrate polarization, and air absorption. In some embodiments, a cleaning method that generates a stable and reliable surface is used.

Figure 6:
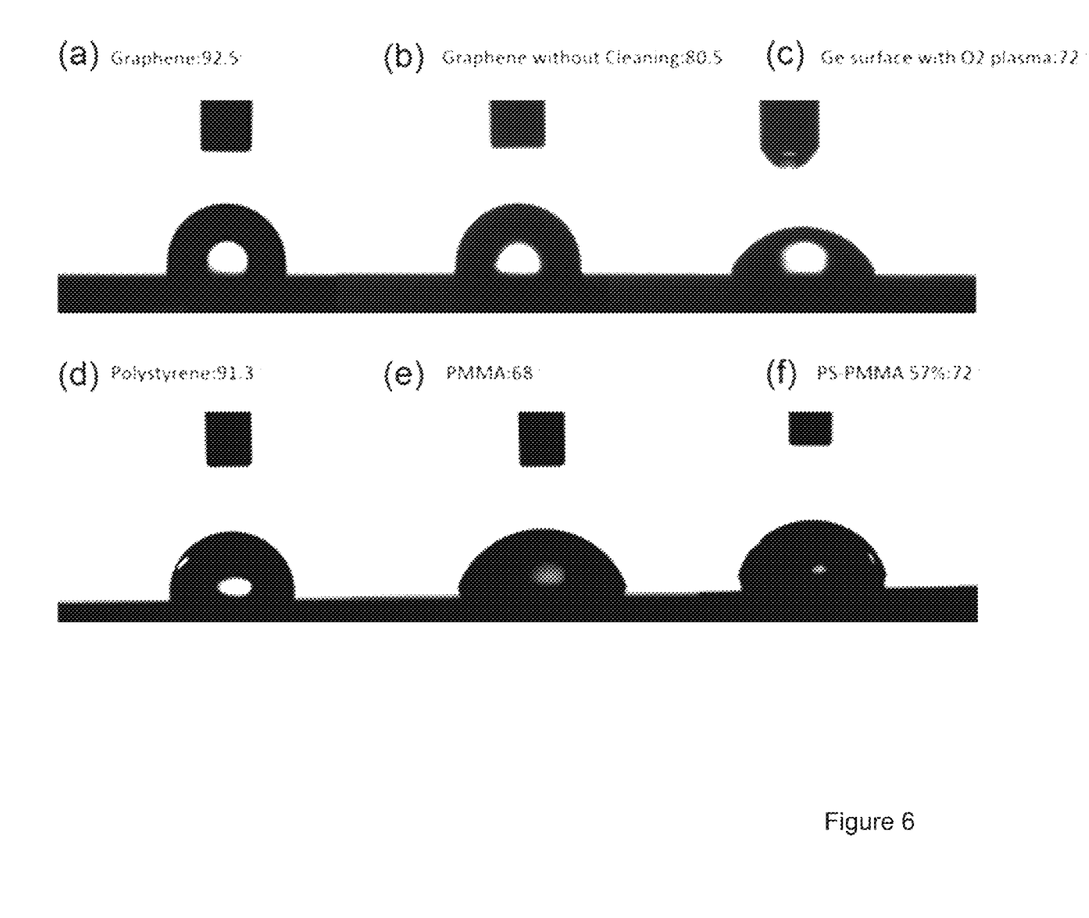
FIG. 6 shows measurements of the water contact angles indicating the hydrophobicity of six different surfaces: a) a graphene surface after photoresist (PR) stripping; b) a graphene surface after further removal of PR using solvent sonication and vacuum thermal annealing at 350° C. for 2 hours; c) after a short oxygen plasma etching of graphene/Ge (111); d) a polystyrene (PS) surface e) a poly(methyl methacrylate) (PMMA) surface; f) and a neutral surface of a PS-PMMA 57% random brush.

FIG. 6 shows water contact angles for (a) a graphene surface after PR stripping, (b) a graphene surface after PR stripping and further removal of PR using solvent sonication and vacuum thermal annealing at 350° C. for 2 hours, (c) a short oxygen plasma etching of graphene/Ge(111), (d) a PS surface, (e) a PMMA surface, and (f) a neutral surface of a PS-PMMA random brush.

The water contact angle of the graphene surface in (a) shows that the hydrophilic surface of the defined graphene can be returned to hydrophobic by thermally annealing away the PMMA residues and air absorbent on the surface (b). Exposing the surface under ambient light for an extended period made the surface become more hydrophobic and served as proof of the absorption of the hydrocarbon contamination. Either way, the contact angle is similar to the cross-linked PS brush used in the large area block copolymer assembly. The hydrophilic part of the chemical contrast comes from short exposure of the graphene surface to oxygen plasma. Here a 50 mTorr plasma with 10 sccm oxygen flow rate and 10 W power for as short as 1 second serves to etch the graphene surface with the plasma. The water contact angle after the plasma exposure is shown in (c) where the contact angle is controlled to close to the neutral surface of the block copolymer used in the experiments described herein.

Directed self-assembly of a lamellae-forming PS-b-PMMA diblock copolymer on a pre-patterned graphene substrate was demonstrated as shown in FIG. 2. The molecular weight of the di-block copolymer was 85 k-b-91 k and the natural lattice distance in bulk ($L_0$) was 78 nm. To guide the assembly of this polymer, an array of graphene stripes with line width of 39 nm and period of 78 nm was used for the chemical pattern to guide the assembly of the di-block copolymer. The spacing and line width were set to match the period and domain dimension of the 85 k-b-91 k block copolymer. This served as a 1:1 chemical pattern. The graphene stripes remaining on the substrate provide the PS preferential surface and the exposed Ge surface was PMMA preferential. Minor photoresist residues from the photoresist definition process were washed away by repeated chlorobenzene and toluene rinsing with ultrasonication. Van der Waal forces between the graphene and Ge surface atoms are stronger than the CVD graphene. No evidence of any damage to the chemical pre-pattern was observed. After the solvent cleaning, the patterned graphene substrate was again annealed under the ultra-high vacuum condition at 350° C. for 2 hours to evaporate the PMMA residue from the e-beam lithography process. This step confined the thickness of the graphene strips to a single atomic level and alleviated any defects. A PS-b-PMMA thin film with a thickness of 60 nm was coated on the substrate.

Figure 7:
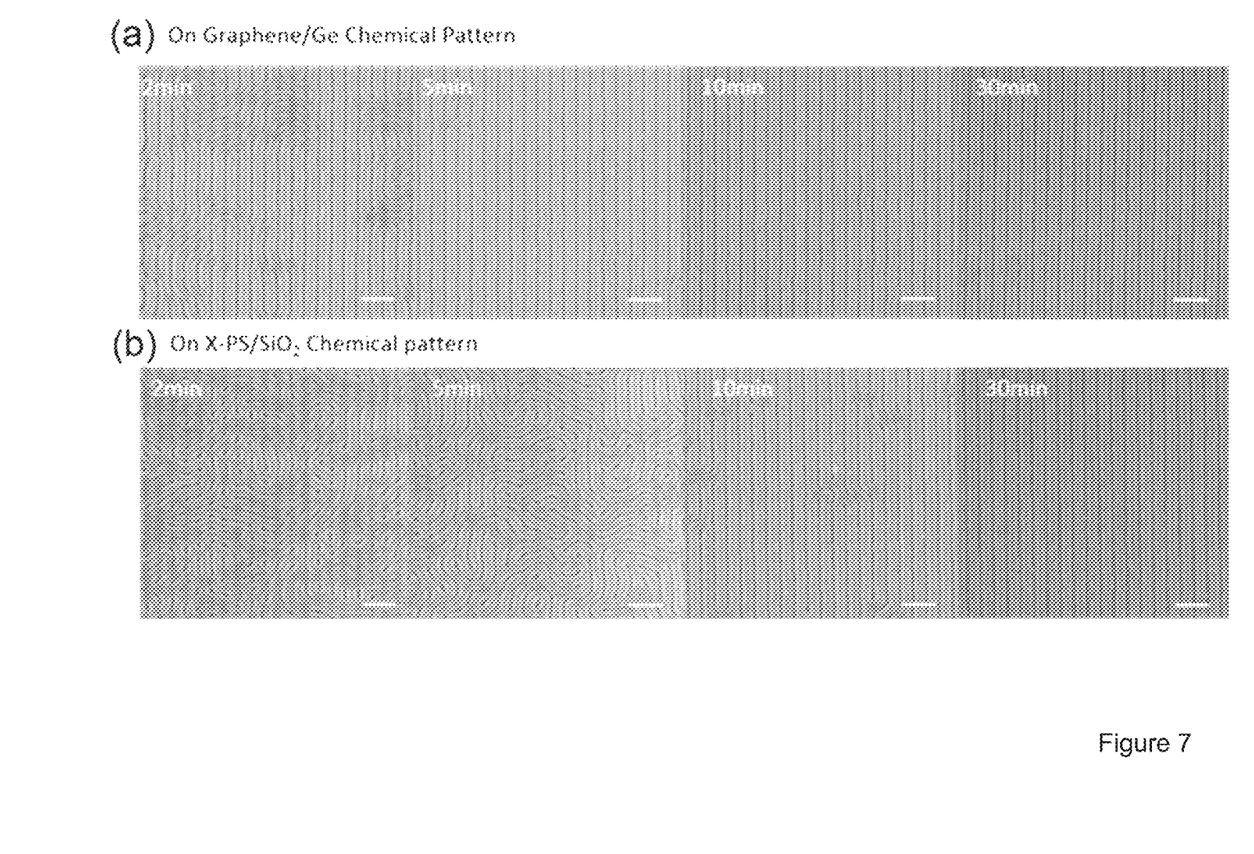
FIG. 7 shows SEM images resulting from a thermal dynamics study of directed self-assembly on (a) a graphene chemical pattern and (b) an X-PS chemical pattern through direct assembly of PS-b-PMMA (85 k-91 k) on graphene and X-PS chemical patterns with assembly times of 2 minutes, 5 minutes, 10 minutes, and 30 minutes.

To compare the thermal dynamics between a graphene chemical pattern and a polystyrene based chemical pattern, a controlled Si substrate with an X-PS brush was also prepared with the same stripes patterns over the brush and coated with same thickness of PS-b-PMMA. Both samples are loaded into a $N_2$ back-flowing glove box and annealed at 250° C. on the hotplate. FIG. 7 shows the directed assembly of PS-b-PMMA on single layer graphene chemical pattern and X-PS chemical pattern at different annealing times. The assembly process converged quickly on the smooth and even surface of the graphene chemical pattern. Within 2 minutes of the annealing time, more than 65% area of the block copolymer was arranged orderly following the underlying chemical pattern. By contrast, after 2 minutes, only localized assembly of short segments had occurred on the X-PS brush. The block copolymer was well guided on more than 95% of the graphene chemical pattern with the improved edge roughness at 5 minutes and become fully ordered at 10 minutes. The same process took 30 minutes on the X-PS brush. Without being bound to a particular theory, the single crystal surface of the graphene may help the polymer move more freely on the chemical pattern and help the assembly converge quickly, in addition to the small surface topography. The faster kinetics on two-dimensional surfaces also results in fewer defects.

To further study the advantages of the assembly on the graphene chemical pattern, the polymer thin film was annealed in a $N_2$ back-flowing glove box with different chemical pattern designs at 250° C. for 30 min. The stretch-ability of the assembled result is demonstrated as shown in FIG. 1, discussed above, with graphene chemical patterns written with pitch size ranging from 65 nm to 88 nm under the same lithography process and annealing conditions. As discussed above, on the atomic thin graphene chemical pattern 15% compressibility and 20% stretch-ability was achieved, a greater commensurability window than that provided by a standard XPS chemical pattern. With only one layer of carbon atoms, the step height difference of the chemical pattern is 0.4 nm. This is compared to a step height difference of 3-4 nm for a typical XPS pattern.

Graphene strips were patterned into 90° arrow bending structures. The block copolymer assembled in accordance with the graphene chemical patterns including a 90° turn over large area, as shown with the low magnification moiré pattern (image (a) in FIG. 3) and a local SEM image (image (b) in FIG. 3). Assembly on an 85 nm pitch showed less edge roughness than assembly on 75 nm pitch for a 1:1 chemical pattern, demonstrating that the diblock copolymer has greater stretch-ability than compressibility.

In some embodiments, the atomic layer patterns may be sparse as compared to the assembled block copolymer. In this manner, patterning resolution can be enhanced. DSA of a block copolymer was demonstrated on a graphene chemical pattern using density multiplication. The graphene was patterned into stripes with periodic spacing distance equal to n times the $L_0$ of the PS-b-PMMA used in the examples above, where n is an integer representing the density multiplication factor. The open areas between guiding stripes were usually neutralized with a brush backfilling step. Surprisingly, it was found that the Ge surface after a weak plasma treatment show a water contact angle falling into the neutral window. (Note that a strong plasma treatment rendered the Ge surface hydrophilic thus becoming PMMA wetting.) In a pattern transfer step after E-beam patterning, a gentle plasma treatment with 50 W RF bias, 10 sccm $O_2$ flow rate, and 10 mTorr chamber pressure was applied for 2 s. This resulted in an etch rate of 60 nm/min on PMMA.

The assembly results of block copolymers with density multiplication are displayed in FIG. 4, discussed above. For ease of viewing, the line width of graphene stripes was patterned to 1.5 $L_0$. From the SEM images in FIG. 4, it can be observed that the block copolymer pattern registered with the chemical pattern accordingly; except for the three domains sitting on graphene stripes (see arrows). As reported previously, a U-shape morphology in cross-sectional view comes from preferential wetting of PS on the graphene surface when the width of a stripe is equal to 1.5 $L_0$. Ge surfaces in between the graphene stripes are considered to be neutral for the diblock copolymer. On this graphene chemical pattern, up to 10 times density multiplication can be achieved.

Figure 8:
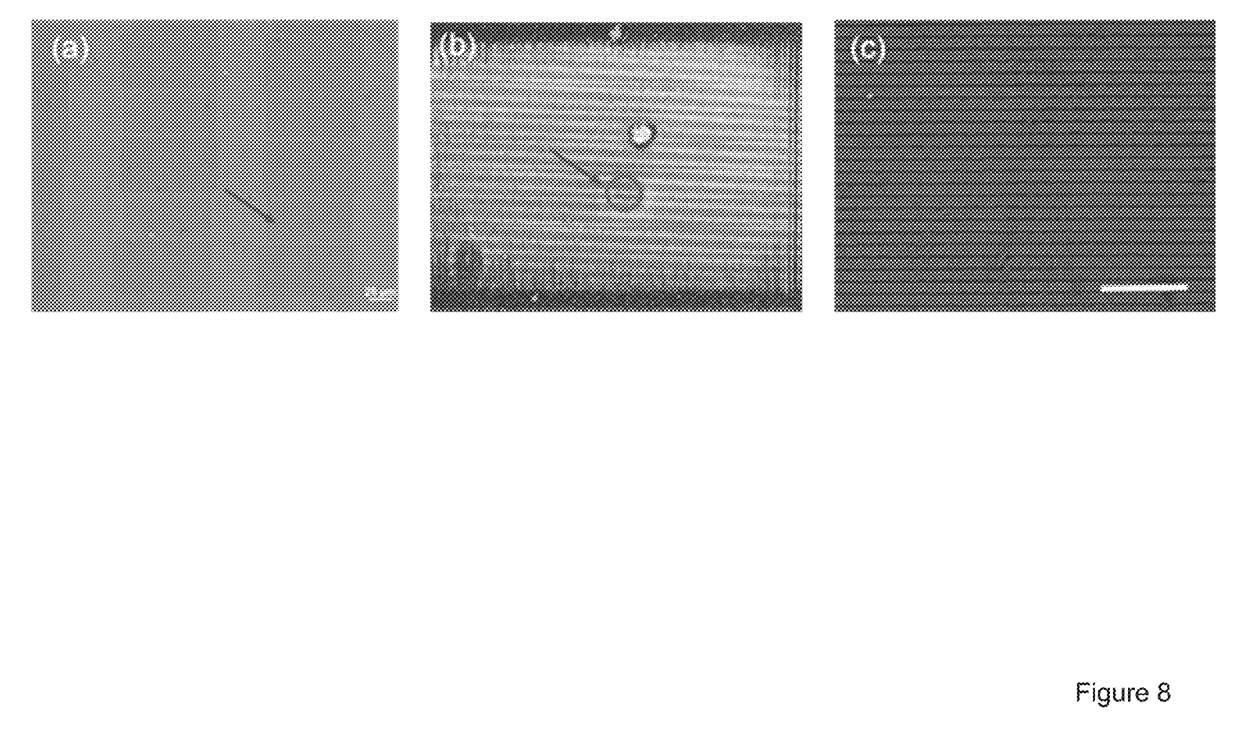
FIG. 8 shows images of a directed self-assembly on a large area graphene chemical pattern created using extreme ultraviolet lithography (EUV).

Block copolymer assembly can be also integrated with state-of-the-art lithography techniques, such as photolithography, 193 nm immersion lithography, and extreme ultraviolet (EUV) technology to generate wafer scale topology patterns. FIG. 8 shows a large area graphene chemical pattern created using extreme ultraviolet lithography (EUV) with the graphene stripes extracted from double patterning of an interference pattern. Image (a) is an optical image of the di-block copolymer assembled on a graphene nanoribbon pattern. The arrow indicates the diffraction graphene nanoribbon pattern. The stripes have a periodic distance of 78 nm. With the same cleaning and assembly process, a 100 micron by 75 micron Moiré pattern can be found in the SEM image of the assembled results (image (b)). It demonstrates regular patterns across the assembly area using graphene as the chemical pattern. Image (c) shows an SEM image of the assembled PS-b-PMMA di-block copolymer.

Various approaches may be used to create an atomic layer chemical contrast pattern. These include patterning by removing portions of a two-dimensional material deposited on a substrate, by any appropriate means including wet or dry chemical etch. Alternatively, chemical contrast may be created by selectively treating portions of a two-dimensional surface, for example, by a wet or dry chemical treatment, or exposure to plasma. In some cases, gentle plasma or element doping may change the wetting behavior of the treated area and create chemical contrast for directed self-assembly. This makes the mass removal unnecessary. In an additive approach a self-assembled monolayer or a second atomic layer can be formed on a first atomic layer. For example, a patterned second two-dimensional material may be located on a first two-dimensional material that has a different surface characteristic. Examples include graphene-BN, $MoS_2$-BN, or any other combination of two or more different two-dimensional materials. A second two-dimensional material may be located on the first two-dimensional material by any appropriate manner including growth on the first two-dimensional material or by transfer to the first two-dimensional material. The second two-dimensional material may be patterned prior to or after transfer to the first two-dimensional material, or may be selectively grown on the first two-dimensional material in the desired pattern.

What is claimed is:

1. A composition comprising:
   a chemical pattern comprising a patterned two-dimensional material; and a microphase-separated block copolymer material overlying the chemical pattern, wherein domains of the microphase-separated block copolymer material are assembled in accordance with the chemical pattern.

2. The composition of claim 1, wherein the two-dimensional material is selected from graphene, graphyne, borophene, silicene, stanene, boron nitride, rhodium, palladium, nickel HITP, tungsten diselenide, and molybdenum disulfide.

3. The composition of claim 1, wherein the two-dimensional material is a transition metal dichalcogenide.

4. The composition of claim 1, wherein patterned features of the chemical pattern have a first density and the domains of the microphase-separated block copolymer material have a second density and wherein the second density is greater than the first density.

5. The composition of claim 4, wherein the second density is at least five times greater than the first density.

6. The composition of claim 5, wherein the second density is at least ten times greater than the first density.

7. The composition of claim 1, wherein the chemical pattern includes a feature that differs from the bulk morphology of the block copolymer.

8. The composition of claim 1, wherein the two-dimensional material is an inorganic material.

9. The composition of claim 1, wherein the chemical pattern does not include a polymer brush, a polymer mat, or a self-assembled monolayer.

10. The composition of claim 1, wherein the two-dimensional material has closed bonds in two-dimensions.

11. The composition of claim 1, wherein the two-dimensional material is selected from carbon nitride and silicon carbide.

12. The composition of claim 1, wherein the microphase-separated block copolymer is microphase-separated into periodic domains.

13. The composition of claim 1, wherein the chemical pattern comprises periodic pattern features.

14. A method comprising:
    providing a composition comprising: a) a chemical pattern, the chemical pattern comprising a patterned two-dimensional material and b) a microphase-separated block copolymer material overlying the chemical pattern, wherein domains of the microphase-separated block copolymer material are assembled in accordance with the chemical pattern and wherein the domains of the microphase-separate block copolymer material form a second pattern; and
    transferring the second pattern to a substrate.

15. The method of claim 14, wherein providing the composition comprises patterning a substrate with the two-dimensional material and depositing the block copolymer material on the two-dimensional material.

16. The method of claim 14, further comprising inducing the block copolymer material to self-assemble in accordance with the chemical pattern.

17. An integrated circuit or patterned media formed by a method of claim 14.

* * * * *